(12) United States Patent
Gratz et al.

(10) Patent No.: US 7,212,438 B2
(45) Date of Patent: May 1, 2007

(54) SEMICONDUCTOR DEVICE AND METHOD OF OPERATING A SEMICONDUCTOR DEVICE

(75) Inventors: Achim Gratz, Dresden (DE); Mayk Röhrich, Dresden (DE)

(73) Assignee: Infineon Technologies AG, Munich (DE)

( * ) Notice: Subject to any disclaimer, the term of this patent is extended or adjusted under 35 U.S.C. 154(b) by 105 days.

(21) Appl. No.: 11/066,731

(22) Filed: Feb. 25, 2005

(65) Prior Publication Data

US 2006/0193166 A1 Aug. 31, 2006

(51) Int. Cl.
  *G11C 16/04* (2006.01)

(52) U.S. Cl. .............................. 365/185.05; 365/185.17
(58) Field of Classification Search ........... 365/185.05, 365/185.17, 185.18, 185.29
  See application file for complete search history.

(56) References Cited

U.S. PATENT DOCUMENTS

| | | | |
|---|---|---|---|
| 4,996,668 A | 2/1991 | Paterson et al. | |
| 5,740,106 A | * 4/1998 | Nazarian | 365/185.1 |
| 5,812,450 A | * 9/1998 | Sansbury et al. | 365/185.01 |
| 6,002,610 A | 12/1999 | Cong et al. | |
| 6,144,580 A | 11/2000 | Murray | |
| 6,356,478 B1 | 3/2002 | McCollum | |
| 6,740,106 B2 | 5/2004 | Kobayashi et al. | |

* cited by examiner

*Primary Examiner*—Vu A. Le
(74) *Attorney, Agent, or Firm*—Slater & Matsil, L.L.P.

(57) ABSTRACT

The invention considers a non-volatile semiconductor memory device comprising a first and second floating gate transistor, which are coupled in series. Each floating gate transistor comprises a floating gate. Programming means coupled to the first and second floating gate transistor are operable to place a selected electrical charge in one of the floating gates and less than the selected electrical charge in the other floating gate to represent either a first or second binary value.

37 Claims, 3 Drawing Sheets

SEMICONDUCTOR DEVICE AND METHOD OF OPERATING A SEMICONDUCTOR DEVICE

TECHNICAL FIELD

The present invention generally relates to a semiconductor memory device, more particularly to an electrically erasable programmable read-only memory cell or an electrically alterable read-only memory cell comprising two floating gate transistors and further concerns to a method of operating such semiconductor memory device.

BACKGROUND

Miniaturization of portable devices requires highly integrated logic chips. Many of these applications use non-volatile memory for storing very few bytes of information. The information may comprise configuration parameters, for example for an adjustment of an analog circuitry or an adaptation to a specific application or external conditions. Alternatively, the information may comprise individual information like a serial device number or an identification number, which are so-called personalization parameters. Typical applications may require a few bytes, e.g., 10 Bytes to about 1 Kilobyte, for storing the personalization parameters and/or configuration parameters.

An example for using such non-volatile memory in a miniaturized application is the adaptation of the filter parameters of a hearing aid by the acoustician to the individual wearing it as well as saving the volume parameters in a hearing aid before turning it off.

Personalization parameters and especially the configuration parameters may be alterable. Configuration parameters are normally not changed during normal operation mode, just before switching off or changing from a normal operation mode to a sleep mode. In particular, battery-powered portable applications may require the personalization parameters and, especially the configuration parameters, to survive the sleep mode or partial power-off without data loss to avoid adapting and configuring the application again.

Conventional applications comprise non-volatile memory-on-board, which is read and programmed by a microcontroller, to store the personalization and configuration parameters.

Alternatively, the application may comprise a non-volatile memory module that is read out at circuit start-up into a volatile memory via an internal controller or a state machine. Adding a non-volatile memory module to a chip, which uses only a few bytes of storage, is very inefficient. Conventional memory modules, which enable the storage of much more data, are oversized.

The time delay incurred by reading out such non-volatile memory to the volatile memory at startup results in inconvenient usage.

Further disadvantages of the non-volatile memory module or the memory-on-board are their power supply requirement and their size.

Conventional programmable elements for logic technologies are not optimized for good retention behavior and they are also difficult to scale. The method to program or erase such elements is very complicated.

Programmable interconnects, for example as used in field programmable gate arrays, so called FPGAs, are not meant for very small memories. They are not optimized for low voltage and low power operation.

SUMMARY OF THE INVENTION

The preferred embodiment of the invention provides a semiconductor memory device that includes programmable configuration elements, e.g., for storing personalization or configuration information. Each programmable configuration element is enabled to represent a first or a second binary value.

The programmable configuration element preferably comprises a first floating gate transistor and a second floating gate transistor which are coupled in series. An output is coupled between the first floating gate transistor and the second floating gate transistor. In other embodiments, other non-volatile memory elements can be used.

Each floating gate transistor comprises a floating gate. The floating gate transistor is non-conductive if a selected electrical charge, which comprises electrons, is placed within the floating gate. If less than the selected electrical charge, especially no or nearly no electrons, are placed within the floating gate, the floating gate transistor is conductive.

A novel aspect of the programmable configuration element is that the selected electrical charge is either stored in a first floating gate, comprised by the first floating gate transistor, or in a second floating gate, comprised by the second floating gate transistor. As a result either the first floating gate transistor is conductive while the second floating gate transistor is not, to represent the first binary value; or the second floating gate transistor is conductive while the first floating gate transistor is not, to represent the second binary value.

Reading voltages are applied across the first and second floating gate transistor to enable sensing if the first binary value is stored or if the second binary value is stored. The reading voltages include a first reading voltage applied to the first floating gate transistor and a second reading voltage applied to the second floating gate transistor. An output voltage between the first and second floating gate transistor depends on which one of the first and second floating gate transistor is conductive. If the first floating gate transistor is conductive, the output voltage is pulled to the first reading voltage. If the second floating gate transistor is conductive the output voltage is pulled to the second reading voltage. Only one of the two floating gate transistors is conductive at any time during the normal operation mode.

At application of the reading voltages the output voltage is immediately and steadily available without draining a static current. Neither separate reading out operations nor further reading out signals are required during the normal operation mode. The full function of the semiconductor memory device is available at low supply voltage with low power drain.

The output signals may be compatible with logic signals. The output voltage being equal or approximately equal to the first reading voltage represents the first binary value, e.g., a logic "1". The second output voltage, which is equal or approximately equal to the second reading voltage, represents the second binary value, e.g., a logic "0".

In a further aspect, the semiconductor device comprises programming circuitry, which is coupled to the first floating gate transistor and the second floating gate transistor. The programming circuitry is operable to place a first selected electrical charge within the first floating gate and to place less than a second selected electrical charge within the second floating gate or is operable to place less than the first selected electrical charge within the first floating gate and to place the second selected electrical charge within the second floating gate. The circuitry may place the selected first or second charge by injecting and storing electrons into the first or second floating gate, respectively. To place less than the selected first or second charge the electrons may be removed.

In another embodiment the semiconductor memory device comprises a plurality of programmable configuration elements each having a first floating gate transistor and a second floating gate transistor coupled in series. Each programmable configuration element further comprises an output coupled between the first and the second floating gate transistor and programming circuitry coupled to at least one of programmable configuration elements. The programming circuitry is operable to place a first selected electrical charge within the first floating gate and to place less than a second selected electrical charge or no charge within the second floating gate, or it is operable to place the second selected electrical charge within the second floating gate and to place less than the first selected electrical charge or no charge within the first floating gate.

During the normal operation mode, the semiconductor memory device is operable to provide a first output voltage at the output of one of the plurality of the programmable configuration elements if the first floating gate transistor is conductive and the second one is not. The semiconductor memory device is also operable to provide a second output voltage at the output when the second floating gate transistor is conductive and the first one is not.

The semiconductor memory device further comprises a plurality of first level shifters to provide writing voltages to the programmable configuration elements. The semiconductor memory device also includes a plurality of programming data lines each coupled to one of the first level shifters to provide the first or second binary value to be programmed.

In one embodiment, the inventive semiconductor memory device does not include a conventional memory cell array and its associated control device. As a result, the size of the semiconductor memory device only depends on the number of programmable configuration elements. Although each programmable configuration element comprises two transistors, in case of storing a few bytes the resulting semiconductor memory device requires less space than a conventional memory cell array including a control device to program and read all memory cells of the array. As an example, the inventive semiconductor memory device may be distributed or immersed within the conventional logic with significantly less overhead than a conventional memory cell array.

One method for operating the semiconductor memory device comprises programming a bit to represent the first binary value by applying writing voltages to the first floating gate transistor and the second floating gate transistor, which are coupled in series. Thereby the first floating gate transistor becomes conductive and second floating gate transistor becomes non-conductive. To represent the second binary value, the writing voltages are applied so that the first floating gate transistor becomes non-conductive and second floating gate transistor becomes conductive.

The method further comprises reading the bit by applying reading voltages to the first floating gate transistor and the second floating gate transistor and subsequently determining if the first binary value is stored by sensing a first output voltage at the output or if the second binary value is stored by sensing a second output voltage.

In a first embodiment of the inventive method, the first and second floating gate transistors are programmed at the same time. The method comprises a step of applying writing voltages by applying a first writing voltage by the programming circuitry to the first floating gate transistor while applying a second writing voltage inverse to the first writing voltage by the programming circuitry to the second floating gate transistor. Alternatively, the first writing voltage is applied to the second floating gate transistor while applying the second writing voltage to the first floating gate transistor. As a result the first and second floating gate are programmed at the same time to represent either a first or second binary value during the normal operation mode.

Another embodiment of the inventive method comprises a first step of programming the bits to represent the first binary value, then a second step of programming the bits to represent the second binary value is performed. Alternatively the second binary values are programmed during the first step, then the first binary values are programmed during the second step.

These and other features and advantages of the invention will become apparent from the following brief description of the drawings, detailed description and appended claims and drafts.

BRIEF DESCRIPTION OF THE DRAWINGS

For a more complete understanding of the present invention and its advantages reference is now made to the following descriptions taken in conjunction with the accompanying drawings in which.

Figure 1:
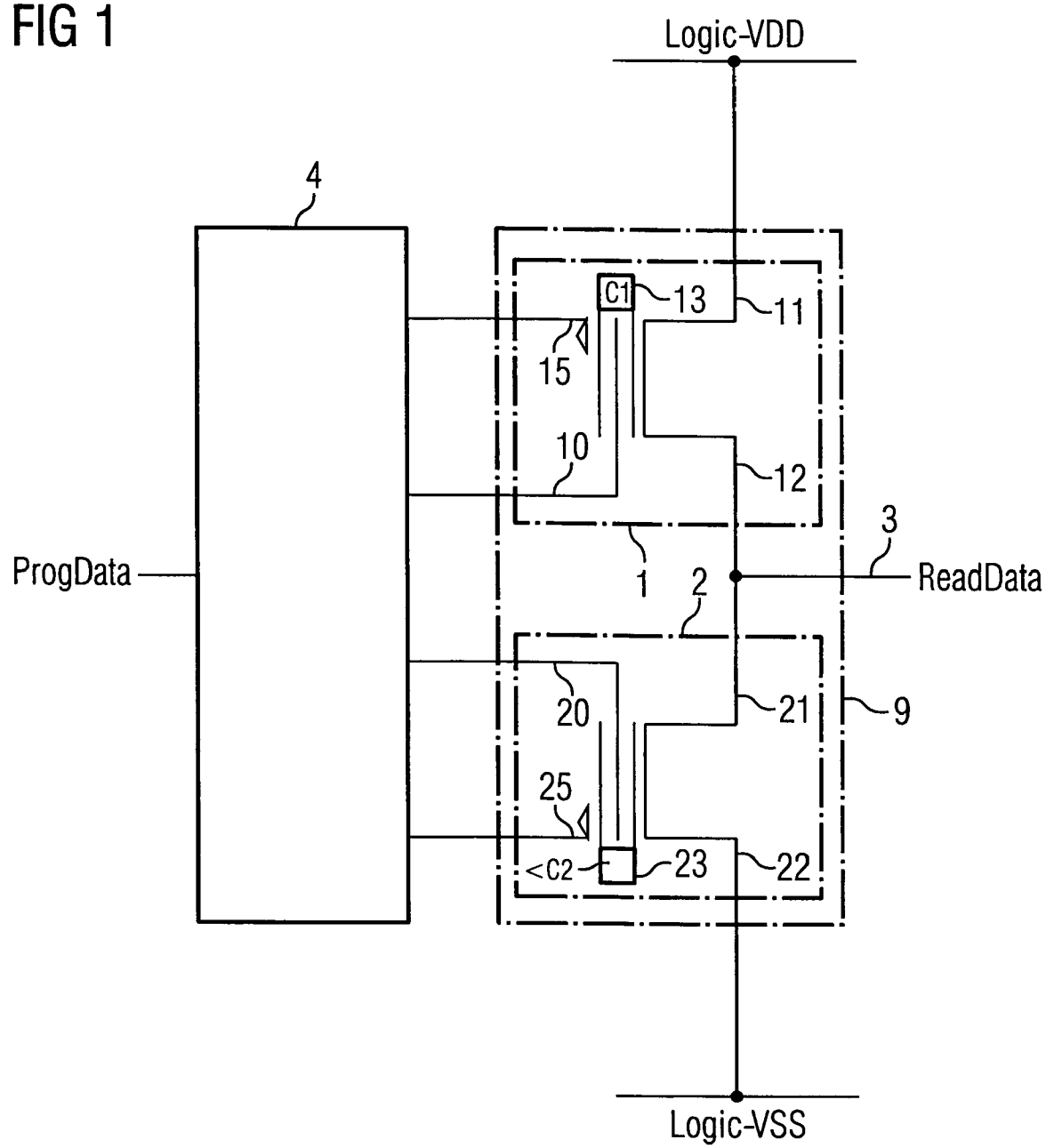
FIG. 1 shows a block diagram of a programmable configuration element.

The following list of reference symbols can be used in conjunction with the figures
9 programmable configuration element
661 first terminal of second level shifter
3 output
662 second terminal of second level shifter
1 first floating gate transistor
663 third terminal of second level shifter
11 first terminal of first floating gate transistor
664 mode input of second level shifter
12 second terminal of first floating gate transistor
Logic-VDD first line
13 first floating gate
Logic-VSS second line
10 first control gate VSS third line
15 first tunnel element
VRead/VProg reading/programming line
2 second floating gate transistor
ProgEnable programming mode signal line
21 first terminal of second floating gate
ProgData programming data line
22 second terminal of second floating gate
ProgPhase programming phase line
23 second floating gate
ReadData reading data line
20 second control gate
D programming data signal
25 second tunnel element
Q data signal
4 programming circuitry
/Q inverse data signal 6 first level shifter
QQ second data signal
61 first terminal of first level shifter
/QQ second inverse data signal
62 second terminal of first level shifter
DD programming phase signal
63 third terminal of first level shifter
ENA programming mode signal
64 mode input of first level shifter
C1 first selected electrical charge
66 second level shifter
C2 second selected electrical charge

DETAILED DESCRIPTION OF ILLUSTRATIVE
EMBODIMENTS

Preferred embodiments are discussed in detail below. It should be noted, though, that the present invention provides many applicable concepts that can be embodied in a wide variety of specific contexts. The specific embodiments discussed are merely illustrative of specific ways to make and use the invention and do not limit the scope of the invention.

FIG. 1 shows a block diagram of a programmable configuration element 9, which comprises a first floating gate transistor 1 and a second floating gate transistor 2. The first floating gate transistor 1 and the second floating gate transistor 2 are coupled in series. An output 3 is coupled in between. The first floating gate transistor 1 includes a first floating gate 13 to store electrons within. The first floating gate transistor 1 further comprises a first control gate 10 and a first tunnel element 15. The first floating gate transistor 1 comprises a first terminal 11 and a second terminal 12. Similar to the first floating gate transistor 1 the second floating gate transistor 2 comprises a first terminal 21, a second terminal 22, a second floating gate 23, a second control gate 20 and a second tunnel element 25.

The second terminal 12 of the first floating gate transistor 1 is coupled to the first terminal 21 of the second floating gate transistor 2. The output 3 is coupled to the second terminal 12 of the first floating gate transistor 1. The first terminal 11 of the first floating gate transistor 1 is coupled to the first line Logic-VDD for applying a first reading voltage which is a power supply. The second terminal 22 of the second floating gate transistor 2 is coupled to the second line Logic-VSS for applying the second reading voltage.

Programming circuitry 4 is coupled to the first floating gate transistor 1 and the second floating gate transistor 2. Activating the programming circuitry 4, a bit, which either represents a first binary value or a second binary value can be programmed and stored in the programmable configuration element 9.

During normal operation mode the programmable configuration element 9, by applying the first and second reading voltage, allows to sense if the first binary value is stored by detecting a first output voltage at the output 3 or if the second binary value is stored by detecting a second output voltage at the output 3.

Typically the first and second floating gate transistor 1, 2 comprise a drain electrode, which may be the first terminal 11, 21 of the first or second floating gate transistor 1, 2, and a source electrode, which may be the second terminal 12, 22 of the first or second floating gate transistor 1, 2.

Each of the first and second floating gate transistors 1, 2 includes a conductive gate (e.g., polysilicon) surrounded by an insulator. Electrical charge, especially electrons, can be stored in the first or second floating gate 13, 23.

Electrons are injected into the floating gate 13, 23 by applying a negative voltage between the tunnel element 15, 25 and the control gate 10, 20. The electrons are removed from the floating gate by applying a positive voltage between the tunnel element 15, 25 and the control gate 10, 20. Other programming and erase techniques can be used if other configuration non-volatile memory cells are used.

A state of the floating gate transistor depends on the amount of charge which is placed within the floating gate. Applying a voltage between the drain electrode and the source electrode of the floating gate transistor, which stores a selected electrical charge, especially electrons, no channel is formed and therefore prevents current from flowing through the floating gate transistor, which is non-conductive in this case. When less than the selected electrical charge, especially no or nearly no electrons or even a positive charge, is placed within the floating gate, a channel is formed beneath the gate and current flows through the floating gate transistor, which is conductive in this case.

The programmable configuration element 9 is operable to represent a first and a second binary value. If the first floating gate transistor 1 is conductive and the second floating gate transistor 2 is not, the first binary value is represented. If the second floating gate transistor 2 is conductive and the first floating gate transistor 1 is not, the second binary value is represented. If the memory cell is not needed, both floating gate transistors 1 and 2 can be rendered non-conductive so that the output 3 is placed in a high impedance state.

FIG. 1 indicates representing the second binary value, because a selected first charge C1 is placed within the first floating gate 13 and less than the second selected charge C2 is placed within the second floating gate 23.

During a normal operation mode the stored bit can be sensed. To read the bit the first reading voltage is applied to the first line Logic-VDD and the second reading voltage is applied to the second line Logic-VSS. An output voltage at the output 3 depends on whether the first floating gate transistor 1 is conductive or the second floating gate transistor 2 is conductive. If the first floating gate transistor 1 is conductive, the output voltage is pulled equal or approximately equal to the first reading voltage. If the second floating gate transistor 2 is conductive the output voltage is pulled equal or approximately equal to the second reading voltage. No current flows between the first line Logic-VDD and the second line Logic-VSS because either the first floating gate transistor 1 or the second floating gate transistor 2 (or both) is non-conductive during the normal operation mode.

Programming the bit to represent the second binary value comprises injecting electrons to place a selected charge C1 onto the first floating gate 13. As a result, the first floating gate transistor 1 is non-conductive. Less than a selected charge C2, is placed within the second floating gate 23, as indicated in FIG. 1. The second floating gate transistor 2 is conductive. Programming the bit to represent the first binary value includes removing the electrons from the first floating gate 1 and injecting electrons into the second floating gate 2. The second floating gate transistor 2 becomes non-conductive, while the first floating gate transistor 1 becomes conductive.

To remove electrons from the first floating gate 13 a high voltage, so-called first writing voltage, is applied between the first tunnel element 15 and the first control gate 10. This causes electrons to be removed from the first floating gate 13 by Fowler-Nordheim tunneling. The first floating gate transistor 1 becomes conductive. By applying a negative voltage, so-called second writing voltage, between the first tunnel element 15 and the first control gate 10 electrons are injected into the first floating gate 13. As a result, the first floating gate transistor becomes non-conductive. The second floating gate transistor 2 is programmed in a similar way by applying the respective first or second writing voltage between the second tunnel element 25 and the second control gate 20.

The first and second floating gate transistors 1, 2 retain the charge representing the bit for years without power supply.

Figure 2:
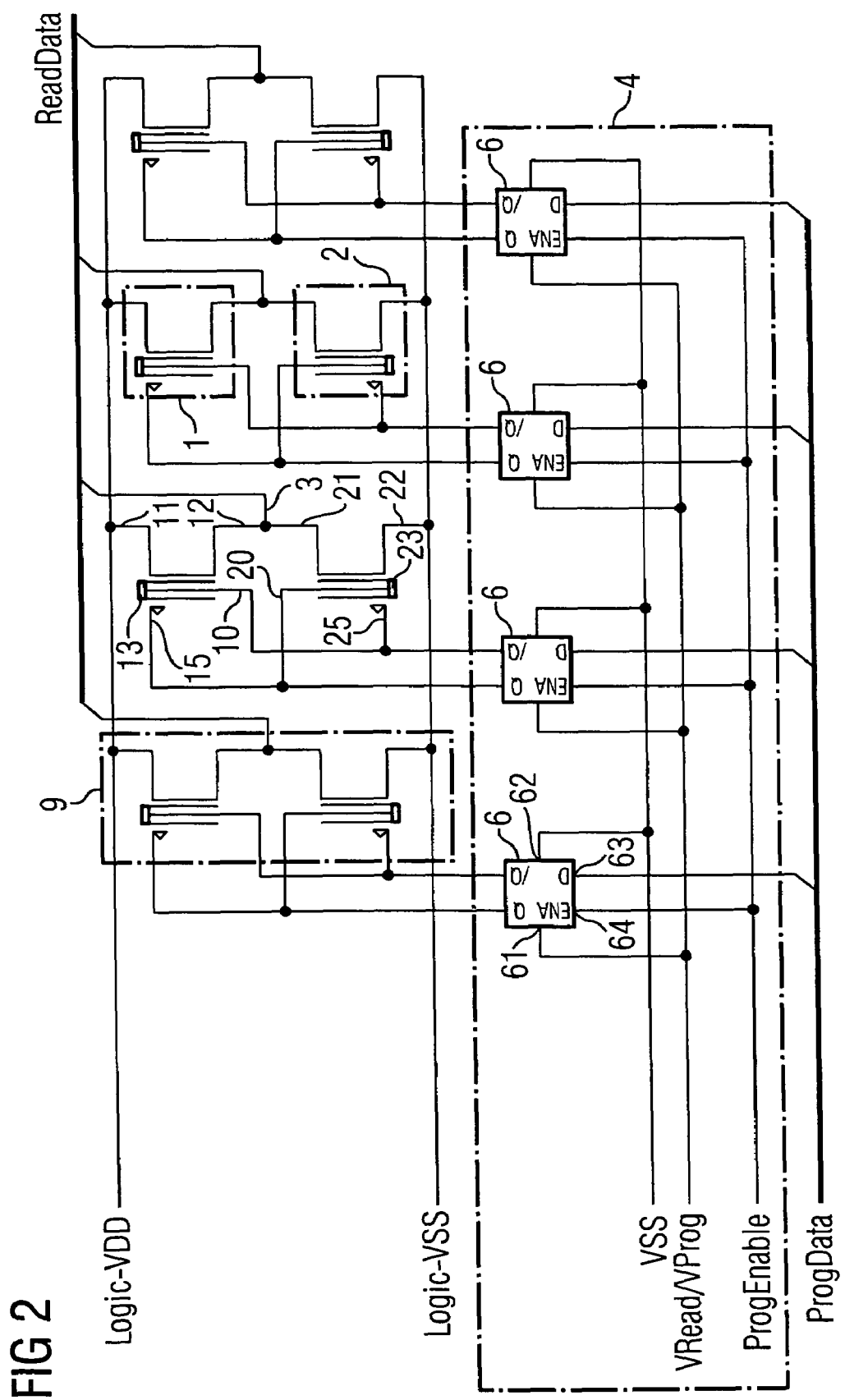
FIG. 2 shows a first embodiment of a semiconductor memory device comprising a multitude of programmable configuration elements.

FIG. 2 shows a first embodiment of an application with a plurality of programmable configuration elements 9 according to FIG. 1. Each programmable configuration element 9 comprises a first floating gate transistor 1 and a second floating gate transistor 2, which are coupled in series.

The first terminals 11 of the first floating gate transistors 1 are coupled to the first line Logic-VDD for power supply. The second terminals 22 of the second floating gate transistors 2 are coupled to the second line Logic-VSS.

The output 3 of each programmable configuration element 9, which is coupled between the first floating gate transistor 1 and the second floating gate transistor 2, is coupled to a reading data line ReadData.

Further, the first embodiment comprises a multitude of first level shifters 6 each comprising a first and second terminal 61, 62. The first terminal 61 is coupled to a reading/programming line VRead/VProg comprising a programming voltage during programming operation or comprising a third reading voltage during reading operation. The second terminal 62 is coupled to a third line VSS, which is grounded.

The first embodiment further includes a programming mode line ProgEnable comprising a programming mode signal ENA coupled to a mode input 64 of the first level shifters 6. The programming mode signal ENA indicates whether programming mode or normal operating mode is selected by activating or not the mode input 64.

A programming data line ProgData is coupled to a third input 63 of each of the first level shifters 6. Each programming data line ProgData comprises a programming data signal D either representing a first or second binary value, which is to be programmed. During programming the mode input 64 of the first level shifter 6 is activated. If the programming data signal D represents the first binary value, the data signal Q is equal to the programming voltage applied to the first terminal 61 and the inverse data signal /Q is grounded according to the second terminal 62. To the contrary, if the programming data signal D represents the second binary value the inverse data signal /Q is equal to the programming voltage and the data signal Q is grounded.

Each level-shifter 6 provides the first and second writing voltage for one of the plurality of programmable configuration elements 9 by coupling the data signal Q to the first tunnel element 15 and the second control gate 20 and coupling the inverse data signal /Q to the second tunnel element 25 and first control gate 10.

During the normal operation mode the bits stored in one programmable configuration element 9 are detectable at its output 3 or the respective reading data line ReadData. The first output voltage can be sensed at the output 3 if the first binary value is stored. Similarly, the second output voltage is provided if the second binary value is stored.

During the normal operating mode the third reading voltage is applied to the first terminal 61 of the first level shifter 6 and the mode input 64 of the first level shifter 6 is deactivated. As a result both the data signal Q and the inverse data signal /Q comprise the third reading voltage and do not depend on the data signal D applied to the level shifter 6. The resulting transistor reading voltages between the tunnel element 15, 25 and the control gate 10, 20 of the first and second floating gate transistor 1, 2 are zero. They do not influence the charge stored in the first and second floating gate 13, 23 during the normal operation mode.

Reading the bits further comprises applying the first reading voltage to the first terminal 11 of the first floating gate transistor 1 by the first line Logic-VDD and applying the second reading voltage to the second terminal 22 of the second floating gate transistor 2 by the second line Logic-VSS. The first voltage is the power supply voltage. The second voltage may be grounded.

The first reading voltage can be sensed at the output 3 if a first binary value is stored and the second reading voltage can be sensed if a second binary value is stored. The first voltage represents the first binary value and the second voltage represents the second binary value. Both voltages are compatible with the logic signals used in non-memory parts of the device, which may be directly coupled to the reading data lines ReadData. Alternatively, a buffer or the like can be coupled between the memory cells and the data lines ReadData. The non-memory parts are not shown.

While performing programming, the reading/programming line VRead/VProg is pulled to the programming voltage, which is higher than the third reading voltage and the mode input 64 of the first level shifter 6 is activated. As a result the voltages, which are provided by the first level shifter 6, across the first and second tunnel elements 15, 25 and the first and second control gates 10, 20, respectively, may influence the charge within the first and second floating gates 13, 23. These voltages include a first and second writing voltage. The first and second reading voltages applied to the first and second lines Logic-VDD, Logic-VSS, respectively, may not be changed during the programming operation. Applying the programming voltage to the tunnel elements and grounding the control gates results in applying the first writing voltage between the tunnel elements and the control gates. The second writing voltage is applied if the tunnel element is grounded and the programming voltage is applied to the control gate.

If the first writing voltage is applied across the first tunnel element 15 and the first control gate 10 and the second writing voltage is applied across the second tunnel element 25 and the second control gate 20, electrical charge is injected and stored in the second floating gate 23 and removed from the first floating gate 13 to represent the first binary value. If the second writing voltage is applied across the first tunnel element 15 and the first control gate 10 and the first writing voltage is applied across the second tunnel element 25 and the second control gate 20 thereby the second binary value is represented.

Figure 3:
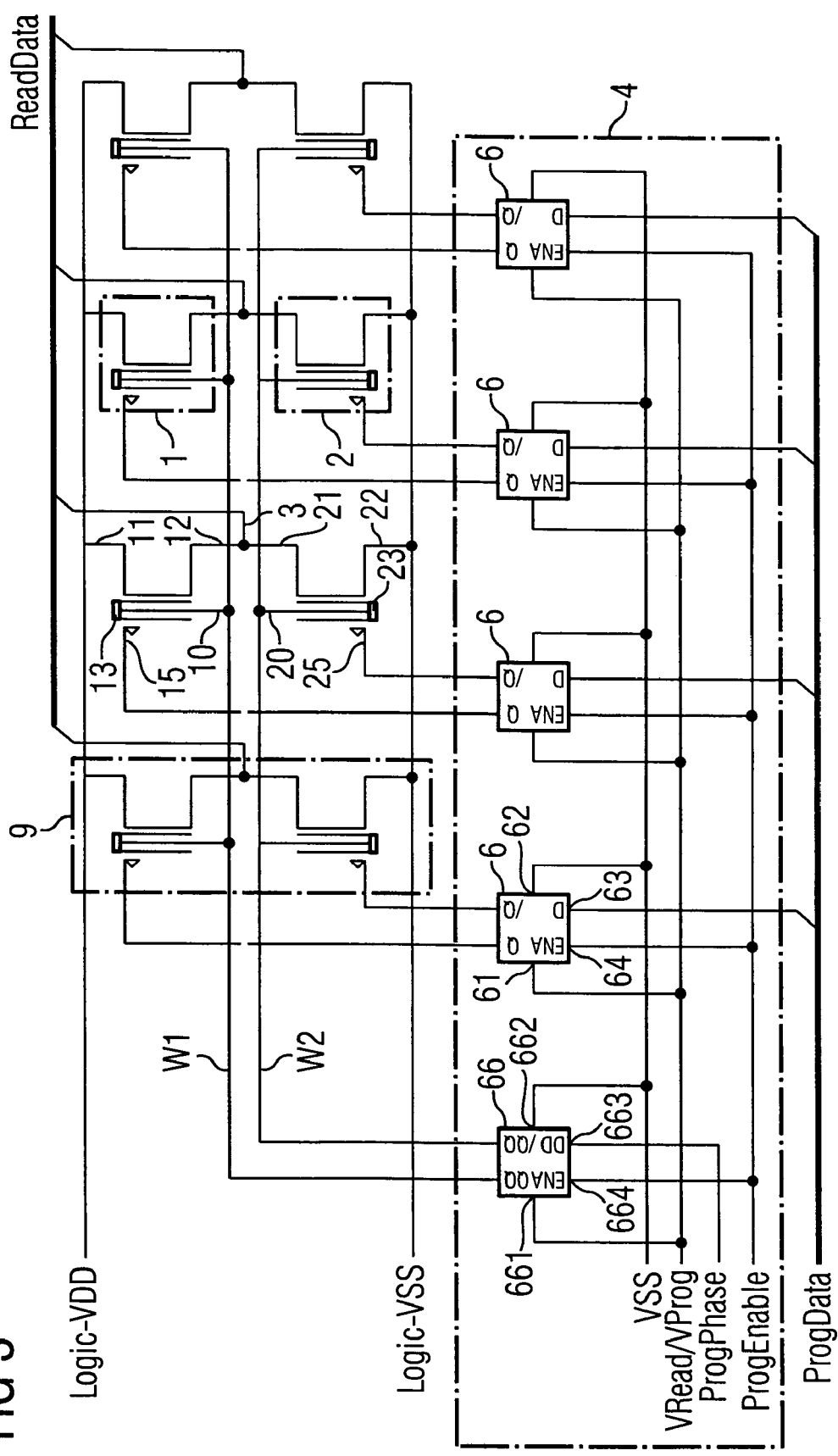
FIG. 3 shows a second embodiment of a semiconductor memory device comprising a multitude of programming configuration elements.

FIG. 3 shows the second embodiment of an application comprising a multitude of programmable configuration elements 9 according to FIG. 2. Each programmable configuration element 9 comprises a first floating gate transistor 1 and a second floating gate transistor 2, which are coupled in series.

The first terminal 11 of the first floating gate transistor 1 is coupled to the first line Logic-VDD for power supply. The second terminal 22 of the second floating gate transistor 2 is coupled to the second line Logic-VSS, which is grounded.

The output 3 of each programmable configuration element 9, which is coupled between the first floating gate transistor 1 and the second floating gate transistor 2, is coupled to a reading data line ReadData.

Similar to FIG. 2, the second embodiment comprises a plurality of first level shifters 6. The first level shifters 6 are coupled to the grounded line VSS, the reading/programming line VRead/VProg, the programming mode signal ENA and the programming data lines ProgData as described above. But the data signal Q and the inverse data signal /Q of the first level shifter 6 is coupled to the first and second floating gate transistors 1, 2 of the respective programmable configuration element 9 in a different way. The data signal Q is coupled only to the first tunnel element 15 and the inverse data signal /Q is coupled only to the second tunnel element 25. The resulting difference with FIG. 2 are described as follows.

The second embodiment further comprises a second level shifter 66, comprising a first terminal 661, which is coupled to the reading/programming line VRead/VProg, and a second terminal 662, which is coupled to the grounded third line VSS. The second level shifter 66 further comprises a third terminal 663 coupled to a programming phase signal DD, which is provided by a programming phase line Prog-Phase. A mode input 664 is coupled to the programming mode signal ENA. The second level shifter 66 provides a second data signal QQ and a second inverse data signal /QQ in the same way the data signal Q and the inverse data signal /Q are provided by the first level shifters 6. The second data signal QQ and the second inverse data signal /QQ both similarly depend on the programming phase signal DD and the programming mode signal ENA.

The second data signal QQ is coupled to the first control gates 10 by a first wordline W1. The second inverse data signal /QQ is coupled to the second control gate 20 by a second wordline W2. As a result the programming and reading voltages applied to the first and second control gates 10, 20 and the first and second tunnel elements 15, 25 of a programmable configuration element 9 depend on the interaction of the respective first level shifters 6 and the second level shifter 66.

Due to the first and second wordlines W1 and W2 the second embodiment according to FIG. 3 requires less space than the first embodiment according to FIG. 2 if more than a few bits are realized at the same location.

During the normal operation mode the first and second reading voltages are applied to the first and second lines Logic-VDD, Logic-VSS. The third reading voltage is applied to the reading/programming line VRead/VProg while the mode inputs 64, 664 of the first and second level shifters 6, 66 are deactivated. The resulting voltages applied between the first and second tunnel elements 15, 25 and the first and second control gates 10, 20, respectively, are zero and do not influence the charge stored in the programmable configuration element 9.

During programming the reading/programming line VRead/VProg is pulled to the programming voltage. Programming the programmable configuration element 9 of the second embodiment further comprises two main steps. One of the first and the second binary value is programmed first, then the other one is programmed.

One programming step comprises programming the second binary value. The programming phase signal is chosen in order to provide the programming voltage by the second data signal QQ and to ground the second inverse data signal /QQ.

If the second binary value is programmed the respective first level shifter 6 provides the programming voltage by the inverse data signal /Q and the data signal Q is grounded. As a result the second writing voltage is applied between the first tunnel element 15 and the first control gate 10 and the first writing voltage is applied between the second tunnel element 25 and the second control gate 20. Electrons are injected into the first floating gate 13, the first floating gate transistor 1 becoming non-conductive and electrons are removed from the second floating gate 23, the second floating gate transistor 2 becoming conductive.

If the first level shifter 6 provides the programming voltage by the data signal Q and the inverse data signal /Q is grounded in order to program to the first binary value, while the programming voltage is provided by the second data signal QQ and the second inverse data signal /QQ is grounded, the resulting voltages between the first tunnel element 15 and the first control gate 10 and the second tunnel element 25 and the second control gate 20 are zero, and the charge within the first and second floating gates is not changed during this step.

The other programming step comprises pulling the second data signal QQ to ground and the second inverse data signal /QQ to the programming voltage by changing the programming phase signal. The data signals Q and the inverse data signals /Q provided by the first level shifters 6 are not changed. As a result the first binary value is programmed.

If the first binary value is to be programmed the respective first level shifter 6 provides the programming voltage by the data signal Q and the inverse data signal /Q is grounded, while the programming voltage is provided by the second inverse data signal /QQ and the second data signal /QQ is grounded. Due to the resulting voltages between the first tunnel element 15 and the first control gate 10 and the second tunnel element 25 and the second control gate 20 electrons are injected into the second floating gate 23, the floating gate transistor 2 becoming non-conductive and electrons are removed from the first floating gate 13, the first floating gate transistor 1 becoming conductive.

If the second binary value is to be programmed to the programmable configuration element 9, the charge within the first and second floating gate is not changed during this programming step.

In the embodiments described above, the non-volatile memory is a floating gate cell. It is understood, however, that other non-volatile memory cells could be used. For example, in one aspect, the present invention decouples the supply of high voltages (VDD, VSS) and the supply of low voltages (Logic-VDD, Logic-VSS). The reading voltages are applied to terminals of the first and second floating gate transistors. Reading voltages that are coupled to the first and second floating gate transistors do not need to be decoupled in order to apply writing voltages. One of the first and second floating gate transistors can be programmed by applying high voltages to its tunnel element and control gate while the reading voltages are still applied to first and second terminals. During reading mode, the high voltages are not applied. In this embodiment, any non-volatile memory cells that can be programmed and read in a similar manner could be used.

What is claimed is:

1. A non-volatile memory cell comprising:
   a first floating gate transistor comprising a first floating gate and a first control gate;
   a second floating gate transistor comprising a second floating gate and a second control gate, the second floating gate transistor being coupled in series with the first floating gate transistor;
   an output coupled between the first floating gate transistor and the second floating gate transistor, such that the output receives an output voltage from either the first floating gate transistor or the second floating gate transistor; and
   programming circuitry coupled to the first floating gate transistor and the second floating gate transistor, the programming circuitry being operable to place a first selected electrical charge within the first floating gate and to place less than a second electrical charge within the second floating gate or being operable to place less than the first selected electrical charge within the first floating gate and to place the second selected electrical charge within the second floating gate, wherein the programming circuitry provides a data signal and an inverse data signal, the data signal being coupled to the first control gate and the inverse data signal being coupled to the second control gate.

2. The semiconductor device in accordance with claim 1 being operable to provide a first state at the output, if less than the first selected electrical charge being placed within the first floating gate and the second selected electrical charge being placed within the second floating gate or being operable to provide a second state at the output, if the first selected electrical charge being placed within the first floating gate and less tan the second selected electrical charge being placed within the second floating gate.

3. The semiconductor device in accordance with claim 1, wherein the first floating gate transistor is conductive if less than the first selected electrical charge is placed within the first floating gate or the first floating gate transistor is non-conductive if the first selected electrical charge is placed within the first floating gate; and wherein the second floating gate transistor is conductive if less than the second selected electrical charge is placed within the second floating gate or the second floating gate transistor is non-conductive if the second selected electrical charge is placed within the second floating gate.

4. The semiconductor device in accordance with claim 1, wherein the first floating gate transistor further comprises a first terminal, a second terminal, and a first tunnel element, the second terminal of the first floating gate transistor being coupled to the output; and
  wherein the second floating gate transistor further comprises a first terminal, a second terminal, and a second tunnel element, the first terminal of the second floating gate transistor being coupled to the second terminal of the first floating gate transistor.

5. The semiconductor device in accordance with claim 4, further comprising:
  a first logic level line being coupled to the first terminal of the first floating gate transistor; and
  a second logic level line being coupled to the second terminal of the second floating gate transistor, the second logic level line being grounded.

6. The semiconductor device in accordance with claim 4, further comprising a programming data line tat carries a programming data signal representing a first or second binary value, the programnnilng data line being coupled to the programming circuitry.

7. The semiconductor device in accordance with claim 6, wherein the data signal is coupled to the first control gate and the second tunnel element, and wherein the inverse data signal is coupled to the second control gate and the first tunnel element.

8. The semiconductor device in accordance wit claim 7, wherein the programming circuitry further comprises:
  a reading/programming line;
  a third line;
  a programming mode signal line; and
  a first level shifter comprising a first terminal, a second terminal, a third terminal and a mode input, which is operable to be activated, the first terminal of the first level shifter being coupled to the readlng/programming line, the second terminal of the first level shifter being coupled to the third line, the third terminal of the first level shifter being coupled to the programming data line, the mode input of the first level shifter being coupled to the programming mode signal line, the level shifter providing the data signal and the inverse data signal.

9. The semiconductor device in accordance with claim 8, wherein, while the mode input of the first level shifter is activated, the data signal provides a voltage that is applied to the first terminal of the first level shifter if the programming data signal representing the first binary value and the inverse data signal provides a voltage which is applied to second terminal of the first level shifter if the programming data signal representing the first binary value;
  while the mode input of the first level shifter is activated, the inverse data signal provides the voltage which is applied to the first terminal of the first level shifter if the programming data signal representing the second binary value and the data signal provides the voltage which is applied to the second terminal of the first level shifter if the programming data signal representing the second binary value; or
  while the mode input of the first level shifter is not activated, the data signal and the inverse data signal provides the voltage which is applied to the first terminal of the first level shifter.

10. A semiconductor device comprising:
  a plurality of programmable configuration elements each comprising a first floating gate transistor, a second floating gate transistor and an output, the first floating gate transistor including a first floating gate, the second floating gate transistor including a second floating gate, the first floating gate transistor and the second floating gate transistor being coupled in series; and the output being coupled between the first floating gate transistor and the second floating gate transistor; and
  programming circuitry coupled to at least one of the plurality of programmable configuration elements, the programming circuitry including a plurality of first level shifters being operable to place a first selected electrical charge within the first floating gate and to place less than a second electrical charge within the second floating gate or being operable to place less than the first selected electrical charge within the first floating gate and to place the second selected electrical charge within the second floating gate.

11. The semiconductor device in accordance with claim 10, wherein the device is operable to provide a first state at the output of one of the plurality of the programmable configuration elements, if less than the first selected electrical charge is placed within the first floating gate of one of the plurality of programmable configuration elements and the second selected electrical charge is placed within the second floating gate of one of the plurality of the programmable configuration elements or is operable to provide a second state at the output, if the first selected electrical charge is placed within the first floating gate of one of the plurality of the programmable configuration elements end less than the second selected electrical charge is placed within the second floating gate of one of the plurality of the programmable configuration elements.

12. The semiconductor device in accordance with claim 10, wherein one of the plurality of the first floating gate transistors is conductive if less than the first selected electrical charge is placed within the first floating gate or one of the plurality of the first floating gate transistors is non-conductive if the first selected electrical charge is placed within the first floating gate, one of the plurality of the second floating gate transistors is conductive if less than the second selected electrical charge is placed within the second floating gate or one of the plurality of the second floating gate transistors is non-conductive if the second selected electrical charge is placed within the second floating gate.

13. The semiconductor device in accordance with claim 10, further including a plurality of programming data lines each carrying a programming data signal representing a first or second binary value, the plurality of programming data lines being coupled to the programming circuitry.

14. The semiconductor device in accordance with claim 13, further comprising
a first line;
and a second line;
wherein the first floating gate transistor of one of the plurality of the programmable configuration elements further comprises a first terminal, a second terminal, a first control gate and a first tunnel element the first terminal of the first floating gate transistor being coupled to the first line, the second terminal of the first floating gate transistor being coupled to the output;
the second floating gate transistor of one of the plurality of the programmable configuration elements further comprises a first terminal, a second terminal, a second control gate and a second tunnel element the first terminal of the second floating gate transistor being coupled to the second terminal of the first floating gate transistor, the second terminal of the second floating gate being coupled to the second line.

15. The semiconductor device in accordance with claim 14, wherein the programming circuitry comprises:
a reading/programming line;
a third line; and
a programming mode signal line;
wherein each level shifter of the plurality at first level shifters comprises a first terminal, a second terminal, a third terminal and a mode input which is operable to be activated, the first terminal of the first level shifters being coupled to the reading/programming line, the second terminal of the first level shifters being coupled to the third line, the third terminal of one of the plurality of the first level shifters being coupled to one of the plurality of programming data lines, the mode input of the first level shifters being coupled to the programming mode signal line, each first level shifter providing a data signal and an inverse data signal.

16. The semiconductor device in accordance with claim 15, wherein
while the mode input is activated, the data signal provides a voltage which is applied to the first terminal of the first level shifter if the programming data signal representing the first binary value and the inverse data signal provides a voltage which is applied to second terminal of the first level shifter if the programming data signal representing the first binary value;
while the mode input is activated, the inverse data signal provides the voltage which is applied to the first terminal of the first level shifter if the programming data signal representing the second binary value and the data signal provides the voltage which is applied to the second terminal of the first level shifter if the programming data signal representing the second binary value; or
while the mode input is not activated, the data signal and the inverse data signal provide the voltage which is applied to the first terminal of the first level shifter.

17. The semiconductor device in accordance with claim 16, wherein one of the plurality of the data signals is coupled to the first control gate and the second tunnel element of one of the plurality of the programmable configuration elements, one of the plurality of the inverse data signals being coupled to the second control gate and the first tunnel element of one of the multitude of the programmable configuration elements.

18. The semiconductor device in accordance with claim 16, further comprising:
a programming phase line carrying a programming phase signal representing a first or second binary value; and
a second level shifter comprising a first terminal, a second terminal, a third terminal and a mode input, which is operable to be activated, the first terminal of the second level shifter being coupled to the reading/programming line, the second terminal of the second level shifter being coupled to the third line, the third terminal of the second level shifter being coupled to the programming phase line, the mode input of the second level shifter being coupled to the programming mode signal line, the second level shifter providing a second data signal and a second inverse data signal.

19. The semiconductor device in accordance with claim 18, wherein:
while the mode input of the second level shifter is activated, the second data signal providing a voltage which is applied to the first terminal of the second level shifter if the programming phase signal representing the first binary value and the second inverse data signal providing a voltage which is applied to the second terminal of the second level shifter if the programming phase signal representing the first binary value;
while the mode input second level shifter is activated, the second inverse data signal providing the voltage which is applied to the first terminal of the second level shifter if the programming phase signal representing the second binary value and the second data signal provides the voltage which is applied to the second terminal of the second level shifter if the programming phase signal representing the second binary value; or
while the mode input second level shiftier is not being activated, the second data signal and the second inverse data signal provides the voltage which is applied to the first terminal of the second level shifter.

20. The semiconductor device in accordance with claim 19, wherein:
one of the plurality of the data signals is coupled to the first tunnel element, one of the multitude of the inverse data signals is coupled to the second tunnel element, the second data signal is coupled to the first control gate, the second inverse data signal is coupled to the second control gate.

21. A method for operating a semiconductor device that comprises a first non-volatile memory cell coupled in series with a second non-volatile memory cell and further comprises an output coupled between the first non-volatile memory cell and the second non-volatile memory cell, the first non-volatile memory cell and the second non-volatile memory cell both including both a control gate and a tunnel element the method comprising:
programming a bit to represent a first binary value by applying writing voltages to at least one of the control gate and/or the tunnel element of the first non-volatile memory cell and to at least one of the control gate and/or the tunnel element of the second non-volatile memory cell to cause the first non-volatile memory cell to become conductive and the second non-volatile memory cell to became non-conductive, or to represent a second binary value by causing the first non-volatile memory cell to become non-conductive and the second non-volatile memory cell to become conductive; and reading the programmed bit from the output coupled between the first non-volatile memory cell and the second non-volatile memory cell.

22. The method in accordance with claim 21, wherein the first non-volatile memory cell comprises a first floating gate transistor and the second non-volatile memory cell comprises a second floating gate transistor.

23. The method in accordance with claim 22, wherein the first floating gate transistor comprises a first terminal, a second terminal, a first control gate and a first tunnel element, the second terminal of the first floating gate transistor being coupled to the output, and wherein the second floating gate transistor comprises a first terminal, a second terminal, a second control gate and a second tunnel element, the first terminal of the second floating gate transistor being coupled to the second terminal of the first floating gate transistor, wherein applying the writing voltages comprises applying the writing voltages to the first control gate, the first tunnel element, the second control gate, the second tunnel element, the first terminal of the first floating gate transistor and the second terminal of the second floating gate transistor.

24. The method in accordance with claim 22, wherein the first floating gate transistor comprises a first terminal, a second terminal, a first control gate and a first tunnel element, the second terminal of the first floating gate transistor being coupled to the output, and wherein the second floating gate transistor further comprising a first terminal, a second terminal, a second control gate and a second tunnel element, the first terminal of the second floating gate transistor being coupled to the second terminal of the first floating gate transistor, wherein reading the programmed bit comprises applying reading voltages to the first control gate, the first tunnel element, the second control gate, the second tunnel element, the first terminal of the first floating gate transistor and the second terminal of the second floating gate transistor.

25. The method in accordance with claim 23, wherein the writing voltages comprise:
 a first voltage being applied to the first terminal of the first floating gate transistor; and
 a second voltage being applied to the second terminal of the second floating gate transistor.

26. The method in accordance with claim 23, wherein the writing voltages to program the bit representing the first binary value include:
 a first writing voltage being applied between the first tunnel element and the first control gate; and
 a second writing voltage being applied between the second tunnel element and the second control gate;
 wherein the writing voltages to program the bit representing the second binary value include:
 the second writing voltage being applied between the first tunnel element and the first control gate; and
 the first writing voltage being applied between the second tunnel element and the second control gate.

27. The method in accordance with claim 23, wherein the step to program the bit representing the first binary value comprises:

applying a first writing voltage between the first tunnel element and the first control gate;
applying a second writing voltage between the second tunnel element and the second control gate;
applying a third writing voltage between the first tunnel element and the first control gate; and
applying a fourth writing voltage between the second tunnel element and the second control gate;
wherein the step of programming the bit representing the second binary value comprises:
applying the fourth writing voltage between the first tunnel element and the first control gate;
applying the third writing voltage between the second tunnel element and the second control gate;
applying the second writing voltage between the first tunnel element and the first control gate; and
applying the first writing voltage between the second tunnel element and the second control gate.

28. The method in accordance with claim 23, wherein programming the bit representing the first binary value comprises:
applying the third writing voltage between the first tunnel element and the first control gate;
applying the fourth writing voltage between the second tunnel element and the second control gate;
applying the first writing voltage between the first tunnel element and the first control gate; and
applying the second writing voltage between the second tunnel element and the second control gate;
wherein programming the bit representing the second binary value comprises:
applying the second writing voltage between the first tunnel element and the first control gate;
applying the first writing voltage between the second tunnel element and the second control gate;
applying the fourth writing voltage between the first tunnel element and the first control gate; and
applying the third writing voltage between the second tunnel element and the second control gate.

29. The method in accordance with claim 27, wherein the third writing voltage is approximately equal to the fourth writing voltage.

30. The method in accordance with claim 29, wherein the third writing voltage and the fourth writing voltage are approximately zero.

31. The method in accordance with claim 24, wherein the reading voltages comprise:
 a first voltage being applied to the first terminal of the first floating gate transistor; and
 a second voltage being applied to the second terminal of the second floating gate transistor.

32. The method in accordance with claim 24, wherein the step of applying the reading voltages includes:
 applying a first transistor reading voltage between the first tunnel element and the first control gate; and
 applying a second transistor reading voltage between the second tunnel element and the second control gate.

33. The method in accordance with claim 32, wherein the first transistor reading voltage is approximately equal to the second transistor reading voltage.

34. The method in accordance with claim 33, wherein the first transistor reading voltage and the second transistor reading voltage are approximately zero.

35. A semiconductor device comprising:
 a first non-volatile memory cell having a current path between a first node and a second node, the first non-volatile memory being configured in either a first state in which the current path is substantially conductive or a second state in which the current path is substantially non-conductive, the first non-volatile memory having a first control gate;

a second non-volatile memory cell having a current path between a first node and a second node, the second non-volatile memory being configured in either the first state or the second state, the first node of the second non-volatile memory cell being coupled to the first node of the first non-volatile memory cell, the second non-volatile memory having a second control gate tat is electrically isolated from the first control gate;

a first logic level node coupled to the second node of the first non-volatile memory cell;

a second logic level node coupled to the second node of the second non-volatile memory cell; and an output node coupled to the first node of the first non-volatile memory cell and the first node of the second non-volatile memory cell;

wherein the output node is coupled to the first logic level node when the first non-volatile memory cell is in the first state;

wherein the output node is coupled to the second logic level node when the second non-volatile memory cell is in the first state; and wherein, whenever the semiconductor device is operational, the first non-volatile memory cell is not in the first state at the same time that the second non-volatile is in the first state.

36. The semiconductor device in accordance with claim 35, wherein the first non-volatile memory cell comprises a floating gate transistor and wherein the second non-volatile memory cell comprises a floating gate transistor.

37. The semiconductor device in accordance with claim 35, and further comprising programming circuitry coupled to the first floating gate transistor and the second floating gate transistor, the programming circuitry being operable to place a first selected electrical charge within the first floating gate and to place less than a second electrical charge within the second floating gate or being operable to place less than the first selected electrical charge within the first floating gate and to place the second selected electrical charge within the second floating.

* * * * *

UNITED STATES PATENT AND TRADEMARK OFFICE
CERTIFICATE OF CORRECTION

PATENT NO. : 7,212,438 B2
APPLICATION NO. : 11/066731
DATED : May 1, 2007
INVENTOR(S) : Gratz et al.

It is certified that error appears in the above-identified patent and that said Letters Patent is hereby corrected as shown below:

Column 11, line 19; delete "tan" insert --than--
Column 11, line 50; delete "tat" insert --that--
Column 11, line 59; delete "wit" insert --with--
Column 11, line 67; delete "reading" insert --reading--

Signed and Sealed this

Nineteenth Day of June, 2007

JON W. DUDAS
*Director of the United States Patent and Trademark Office*